US011435476B2

(12) United States Patent
Xu et al.

(10) Patent No.: US 11,435,476 B2
(45) Date of Patent: Sep. 6, 2022

(54) TIME-OF-FLIGHT RGB-IR IMAGE SENSOR

(71) Applicant: Microsoft Technology Licensing, LLC, Redmond, WA (US)

(72) Inventors: Zhanping Xu, Sunnyvale, CA (US); Vei-Han Chan, San Jose, CA (US); Sunil Prakash Acharya, Los Altos, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 1000 days.

(21) Appl. No.: 16/159,468

(22) Filed: Oct. 12, 2018

(65) Prior Publication Data
US 2020/0116862 A1 Apr. 16, 2020

(51) Int. Cl.
*G01S 17/08* (2006.01)
*G01S 7/48* (2006.01)
(Continued)

(52) U.S. Cl.
CPC ............ *G01S 17/08* (2013.01); *G01S 7/4865* (2013.01); *G01S 7/52068* (2013.01); *G01S 17/89* (2013.01); *H01L 27/14875* (2013.01)

(58) Field of Classification Search
CPC .... G01S 17/08; G01S 7/4865; G01S 7/52068; G01S 17/89; G01S 17/86; G01S 17/894;
(Continued)

(56) References Cited

U.S. PATENT DOCUMENTS 4,864,395 A 9/1989 Tajima
5,579,107 A 11/1996 Wright et al.
(Continued)

FOREIGN PATENT DOCUMENTS

EP 2116864 A1 11/2009
EP 2157401 A1 2/2010
(Continued)

OTHER PUBLICATIONS

"Office Action Issued in Korean Patent Application No. 10-2013-7001077", dated May 16, 2017, 6 Pages.
(Continued)

*Primary Examiner* — Seung C Sohn
(74) *Attorney, Agent, or Firm* — Alleman Hall Creasman & Tuttle LLP

(57) ABSTRACT

A three-dimensional time-of-flight (TOF) RGB-IR image sensor is provided, including a signal generator configured to generate a modulated electrical signal. The three-dimensional TOF RGB-IR image sensor may further include a light-emitting diode (LED) configured to receive the modulated electrical signal and emit modulated light. The three-dimensional TOF RGB-IR image sensor may further include a TOF sensor integrated circuit configured to receive light at the light-receiving surface and generate a photoelectrical signal based on the received light. The received light may include ambient light and reflected modulated light. The three-dimensional TOF RGB-IR image sensor may further include a filter array located on the light-receiving surface of the TOF sensor integrated circuit. The filter array may include a plurality of pixels, each pixel including an infrared-transmitting bandpass filter and one or more visible-light-transmitting bandpass filters located adjacent to the infrared-transmitting bandpass filter.

20 Claims, 10 Drawing Sheets

(51) Int. Cl.
*G01S 7/52* (2006.01)
*G01S 17/89* (2020.01)
*H01L 27/148* (2006.01)
*G01S 7/4865* (2020.01)

(58) Field of Classification Search
CPC . G01S 7/4816; G01S 17/36; H01L 27/14875; H01L 27/14621; H04N 5/36965
See application file for complete search history.

(56) References Cited

U.S. PATENT DOCUMENTS

| | | | |
|---|---|---|---|
| 5,581,345 | A | 12/1996 | Oki et al. |
| 6,323,942 | B1 | 11/2001 | Bamji |
| 6,515,740 | B2 | 2/2003 | Bamji et al. |
| 6,580,496 | B2 | 6/2003 | Bamji et al. |
| 6,697,010 | B1 | 2/2004 | Lam |
| 6,906,793 | B2 | 6/2005 | Bamji et al. |
| 7,589,316 | B2 | 9/2009 | Dunki-Jacobs |
| 7,719,662 | B2 | 5/2010 | Bamji et al. |
| 8,587,771 | B2 | 11/2013 | Xu et al. |
| 9,580,496 | B2 | 2/2017 | Gearing |
| 9,595,550 | B2 | 3/2017 | Bamji |
| 10,425,628 | B2 * | 9/2019 | Price .................... H04N 13/254 |
| 10,645,367 | B2 * | 5/2020 | Gupta .................... G01S 7/4915 |
| 2001/0022371 | A1 | 9/2001 | Rhodes |
| 2006/0128087 | A1 | 6/2006 | Bamji et al. |
| 2007/0127009 | A1 | 6/2007 | Chen et al. |
| 2008/0068583 | A1 | 3/2008 | Hiraide |
| 2008/0180650 | A1 | 7/2008 | Lamesch |
| 2009/0237640 | A1 | 9/2009 | Krikorian et al. |
| 2011/0292380 | A1 | 12/2011 | Bamji |
| 2012/0013887 | A1 | 1/2012 | Xu et al. |
| 2012/0044406 | A1 | 2/2012 | Shimoda et al. |
| 2013/0120623 | A1 | 5/2013 | Kim |
| 2015/0001664 | A1 | 1/2015 | Van Der Tempel et al. |
| 2016/0181314 | A1 | 6/2016 | Wan et al. |
| 2017/0146657 | A1 | 5/2017 | Xu |
| 2019/0355136 | A1 | 11/2019 | Ortiz et al. |
| 2021/0190996 | A1 | 6/2021 | Xu et al. |
| 2021/0356628 | A1 | 11/2021 | Xu et al. |

FOREIGN PATENT DOCUMENTS

| | | |
|---|---|---|
| JP | H09269372 A | 10/1997 |
| JP | 2000517427 A | 12/2000 |
| JP | 2006214998 A | 8/2006 |
| JP | 2008164496 A | 7/2008 |
| JP | 2009063303 A | 3/2009 |

OTHER PUBLICATIONS

"Office Action Issued in European Patent Application No. 11807282.6", dated Jul. 24, 2014, 4 Pages.
"Office Action Issued in European Patent Application No. 11807282.6", dated Jan. 27, 2015, 4 Pages.
"Search Report Issued in European Patent Application No. 11807282.6", dated Apr. 17, 2013, 8 Pages.
"Non-Final Office Action Issued in U.S. Appl. No. 12/658,806", dated Sep. 9, 2013, 8 Pages.
"Non-Final Office Action Issued in U.S. Appl. No. 14/449,800", dated Aug. 23, 2016, 8 Pages.
"Non Final Office Action Issued in U.S. Appl. No. 15/421,821", dated Feb. 26, 2019, 9 Pages.
"First Office Action Issued in Chinese Patent Application No. 201110206379.8", dated Nov. 2, 2012, 9 Pages.
"Second Office Action Issued in Chinese Patent Application No. 201110206379.8", dated May 14, 2013, 8 Pages.
"Office Action Issued in Japanese Patent Application No. 2013-520728", dated Feb. 19, 2015, 7 Pages.
"International Search Report and Written Opinion Issued in PCT Application No. PCT/US2011/42643", dated Dec. 22, 2011, 8 Pages.
"U.S. Appl. No. 15/950,518, filed Apr. 11, 2018", 24 Pages.
"International Search Report and Written Opinion Issued in PCT Application No. PCT/US20/059917", dated Mar. 24, 2021 18 Pages.
"International Search Report and Written Opinion Issued in PCT Application No. PCT/US19/052531", dated Dec. 13, 2019, 11 Pages.
Xu, Zhanping, "Investigation of 3D-lmaging Systems Based on Modulated Light and Optical RF-Interferometry", In Dissertation Submitted for the Degree of Doctor of Technical Sciences to the Department of Electrical Engineering and Computer Science, University of Siegen, 1999, 14 Pages.

* cited by examiner

TIME-OF-FLIGHT RGB-IR IMAGE SENSOR

BACKGROUND

Time of Flight (TOF) pixel-based 3D cameras have found wide applications in industrial and factory automation, car driving assistance, gaming, image recognition, and other areas. To augment the depth information gathered by a TOF 3D camera, computing devices often include RGB (red-green-blue) cameras along with TOF 3D cameras, to thereby sense RGB and depth information for an imaged scene at the same time.

In existing devices, TOF 3D cameras and RGB cameras are provided close together, but in spatially separate sensor arrays. In such configurations, since the TOF 3D camera and RGB camera receive light along slightly different axes, it can be problematic to align and calibrate each camera, to enable the RGB information and depth captured from the same point in the scene to be properly associated with each other. In addition, with spatially separate sensor arrays, the TOF 3D camera or the RGB camera may partially occlude the other camera, which is undesirable. Using separate sensor arrays for the TOF 3D camera and the RGB camera may also make the device that includes the cameras larger, not suitable for close-range operation, and/or more expensive to manufacture.

SUMMARY

According to one aspect of the present disclosure, a three-dimensional time-of-flight (TOF) RGB-IR image sensor is provided, including a signal generator configured to generate a modulated electrical signal. The three-dimensional TOF RGB-IR image sensor may further include a light-emitting diode (LED) configured to receive the modulated electrical signal and emit modulated light. The three-dimensional TOF RGB-IR image sensor may further include a TOF sensor integrated circuit configured to receive light at the light-receiving surface and generate a photoelectrical signal based on the received light. The received light may include ambient light and reflected modulated light. The three-dimensional TOF RGB-IR image sensor may further include a filter array located on the light-receiving surface of the TOF sensor integrated circuit. The filter array may include a plurality of pixels, each pixel including an infrared-transmitting bandpass filter and one or more visible-light-transmitting bandpass filters located adjacent to the infrared-transmitting bandpass filter.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

Figure 1:
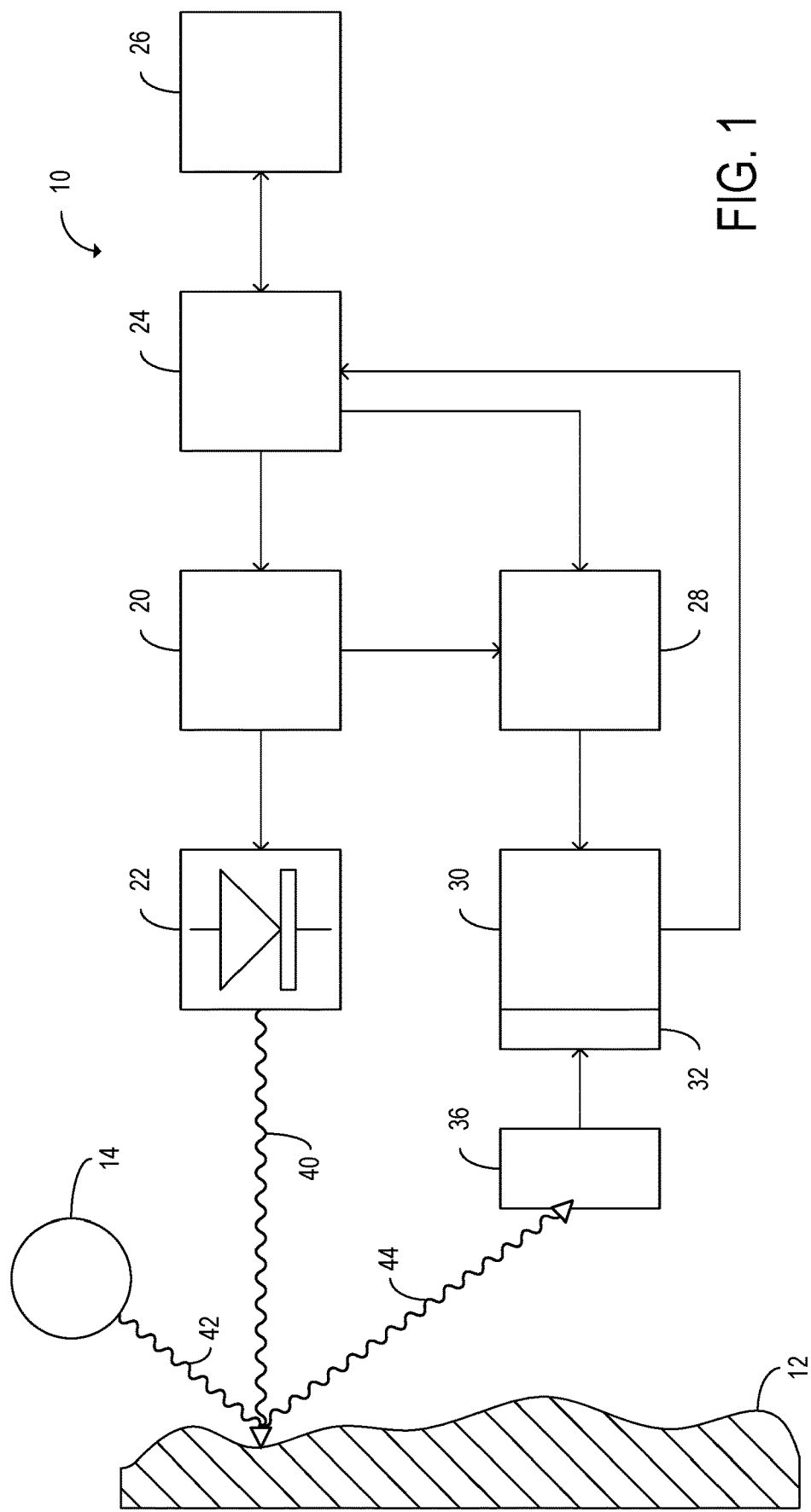
FIG. 1 schematically depicts a three-dimensional TOF RGB-IR image sensor, according to one embodiment of the present disclosure.

In order to address the problems discussed above, a three-dimensional time-of-flight (TOF) RGB-IR image sensor is provided. The three-dimensional TOF RGB-IR image sensor is configured to provide time-of-flight sensing and color sensing in a single sensor array. Therefore, the three-dimensional TOF RGB-IR image sensor may avoid the problems discussed above that result from the use of separate sensor arrays for time-of-flight sensing and color sensing. FIG. 1 schematically depicts a three-dimensional TOF RGB-IR image sensor 10 according to one embodiment of the present disclosure. The three-dimensional TOF RGB-IR image sensor 10 may be included in a computing device. In the embodiment of FIG. 1, the three-dimensional TOF RGB-IR image sensor 10 is configured to determine time-of-flight information and color information for an imaged object 12 illuminated by ambient light 42 from an ambient light source 14.

The three-dimensional TOF RGB-IR image sensor 10 may, in some embodiments, include a controller 24, which may, for example, include one or more processors. The controller 24 may be configured to receive one or more inputs from a user via one or more input devices. The controller 24 may additionally or alternatively be configured to receive the one or more inputs from an application program 26. The controller 24 may be further configured to transmit one or more outputs to the application program 26 and/or to one or more other components of the three-dimensional TOF RGB-IR image sensor 10. The one or more outputs may include one or more control signals indicating operations to be performed at the one or more other components.

The three-dimensional TOF RGB-IR image sensor 10 may include a signal generator 20 configured to generate a modulated electrical signal. The signal generator 20 may generate the modulated electrical signal in response to a control signal received from the controller 24. In some embodiments, the modulated electrical signal may be an amplitude-modulated electrical signal. In other embodiments, the modulated electrical signal may be a frequency-modulated electrical signal. In embodiments in which it is frequency-modulated, the modulated electrical signal may modulate in frequency so as to have beats (signal peaks)

spaced in time with a predetermined modulation frequency greater than the frequency of the electrical signal. In such embodiments, the predetermined modulation frequency may be in the radio frequency range. Similarly, in embodiments in which the modulated electrical signal is an amplitude-modulated electrical signal, amplitude modulation may occur with a predetermined modulation frequency.

The three-dimensional TOF RGB-IR image sensor 10 may further include a light-emitting diode (LED) 22 configured to receive the modulated electrical signal. In some embodiments, a light emitter other than an LED, such as a laser diode, may be used. The LED 22 may be further configured to emit modulated light 40 based on the modulated electrical signal. The modulated light 40 may be amplitude-modulated in embodiments in which the modulated electrical signal is amplitude-modulated and frequency-modulated in embodiments in which the modulated electrical signal is frequency-modulated. The modulated light 40 may be directed toward the imaged object 12.

The three-dimensional TOF RGB-IR image sensor 10 may further include a TOF sensor integrated circuit 30. The TOF sensor integrated circuit 30 may include a light-receiving surface. Light 44 received at the light-receiving surface of the TOF sensor integrated circuit 30 may include ambient light 42, which may be reflected off the imaged object 12 or some other object. The ambient light 42 may additionally or alternatively be received directly from the ambient light source 14. The received light 44 may further include the modulated light 40 reflected off the imaged object 12.

In some embodiments, the received light 44 may be focused onto the TOF sensor integrated circuit 30 using a micro-lens 36. The TOF sensor integrated circuit 30 may be configured to receive the light 44 via a filter array 32 located on the light-receiving surface of the TOF sensor integrated circuit 30. As shown below with reference to FIGS. 2A-B, the micro-lens 36 may be located on a light-receiving side of the filter array 32, which may be an opposite side of the filter array 32 from the TOF sensor integrated circuit 30. Thus, the received light 44 may pass through the micro-lens 36 and the filter array 32 before reaching the light-receiving surface of the TOF sensor integrated circuit 30.

Figure 2A:
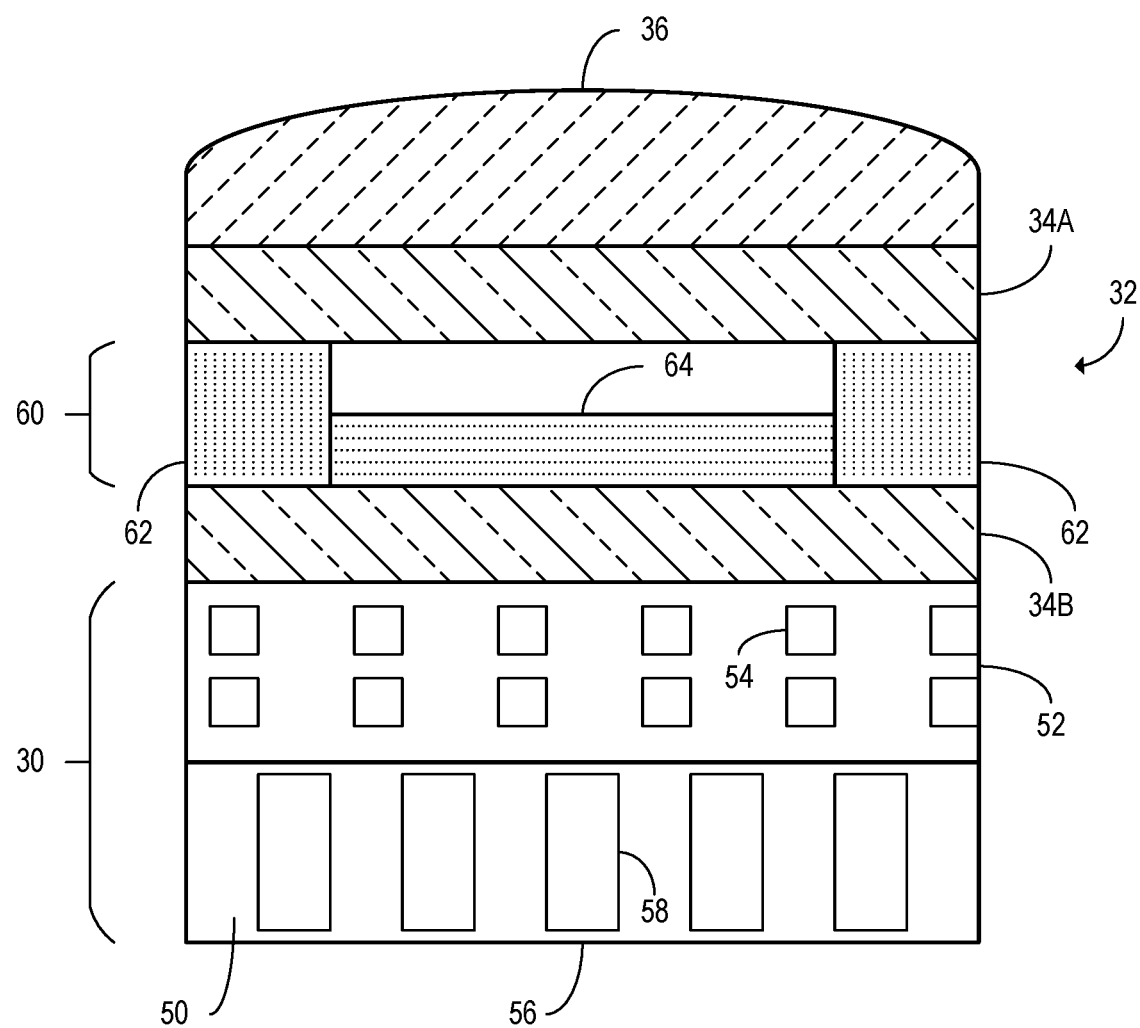
FIGS. 2A-B show cross-sectional views of example TOF sensor integrated circuits that may be included in the three-dimensional TOF RGB-IR image sensor of FIG. 1.
Figure 2B:
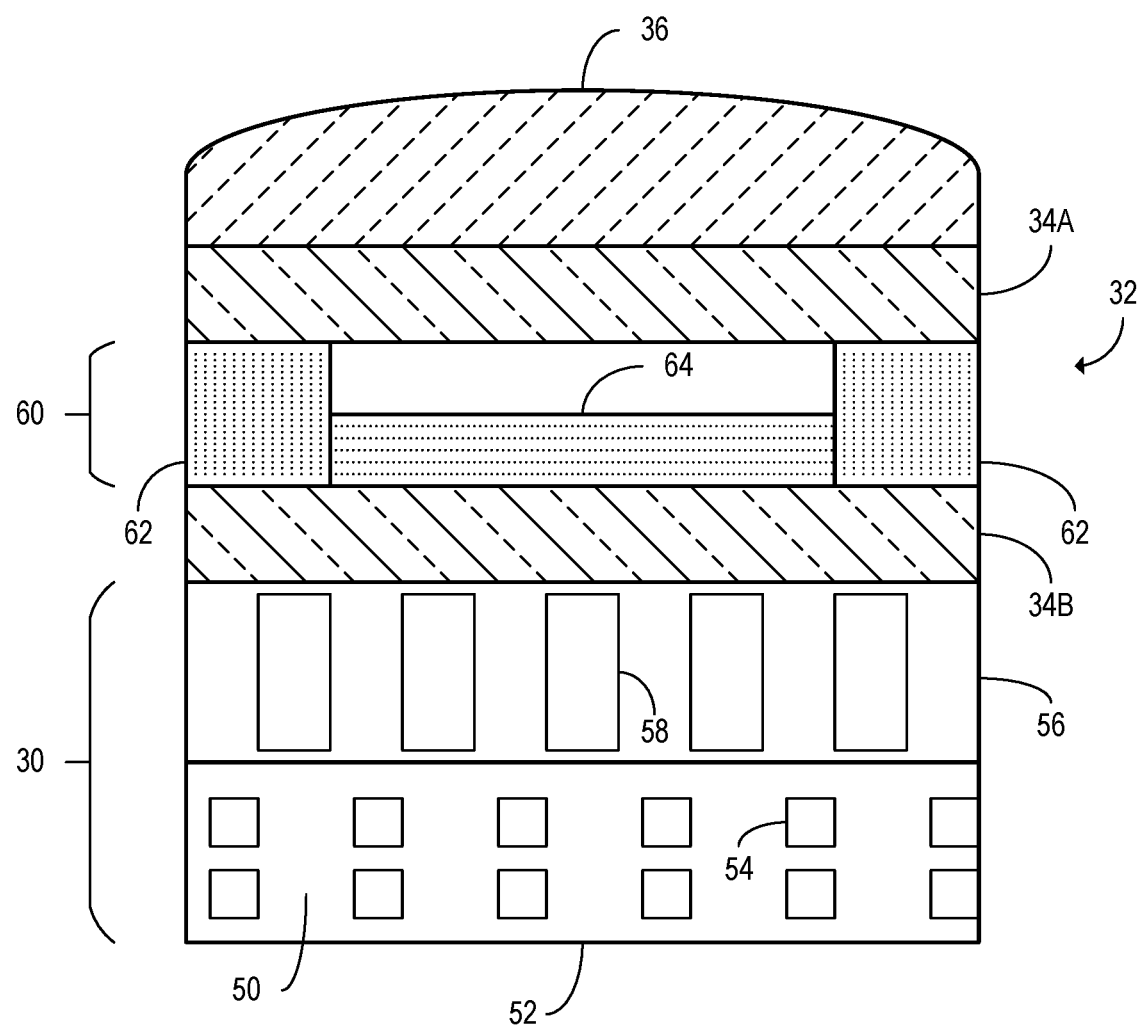

Cross-sectional side views of example configurations of the TOF sensor integrated circuit 30 are shown with reference to FIGS. 2A-B. The TOF sensor integrated circuit 30 shown in FIG. 2A includes a silicon substrate 50 in which a wiring layer 52 and a photodetector layer 56 are mounted. The wiring layer 52 as shown in FIG. 2A includes a plurality of wires 54 via which electric current may be carried through the TOF sensor integrated circuit 30. The photodetector layer 56 includes a plurality of photodetector cells 58. The photodetector cells 58 may, for example, emit electric current via the photoelectric effect when light is incident on the photodetector cells 58. In the embodiment of FIG. 2A, the TOF sensor integrated circuit 30 has a front-side illuminated (FSI) configuration in which the wiring layer 52 is located between the filter array 32 and the photodetector layer 56. In other embodiments, as shown in FIG. 2B, the TOF sensor integrated circuit 30 may have a back-side illuminated (BSI) configuration in which the photodetector layer 56 is located between the filter array 32 and the wiring layer 52.

As shown in FIGS. 2A-B, the three-dimensional TOF RGB-IR image sensor 10 may further include a micro-lens 36 located opposite the TOF sensor integrated circuit 30 relative to the filter array 32 and configured to focus the received light 44 onto the filter array 32. In some embodiments, the three-dimensional TOF RGB-IR image sensor 10 may further include a first visible-transparent layer 34A located between the micro-lens 36 and the filter array 32. The three-dimensional TOF RGB-IR image sensor 10 may additionally or alternatively include a second visible-transparent layer 34B located between the TOF sensor integrated circuit 30 and the filter array 32. The first visible transparent layer 34A and the second visible transparent layer 34B may affix the filter array 32 to the micro-lens 36 and the TOF sensor integrated circuit 30 respectively.

In some embodiments, the filter array 32 may include a plurality of pixels 60. Each pixel 60 may include an infrared-transmitting bandpass filter 62. In some embodiments, a plurality of infrared-transmitting bandpass filters 62 may be included in the filter array 32. Each pixel 60 may further include one or more visible-light-transmitting bandpass filters 64. As shown in FIGS. 2A-B, the one or more visible-light-transmitting bandpass filters 64 may be located adjacent to the infrared-transmitting bandpass filter 62. The one or more visible-light-transmitting bandpass filters 64 may be configured to transmit light selected from the group consisting of red light, green light, blue light, and full-visible-spectrum light, as discussed below with reference to FIGS. 3A-B. In some embodiments, the filter array 32 may additionally or alternatively include one or more visible-light-transmitting bandpass filters 64 configured to transmit other colors of light, such as cyan, yellow, magenta, and emerald. One or more ultraviolet-light-transmitting bandpass filters may be further included in some embodiments.

Figure 3A:
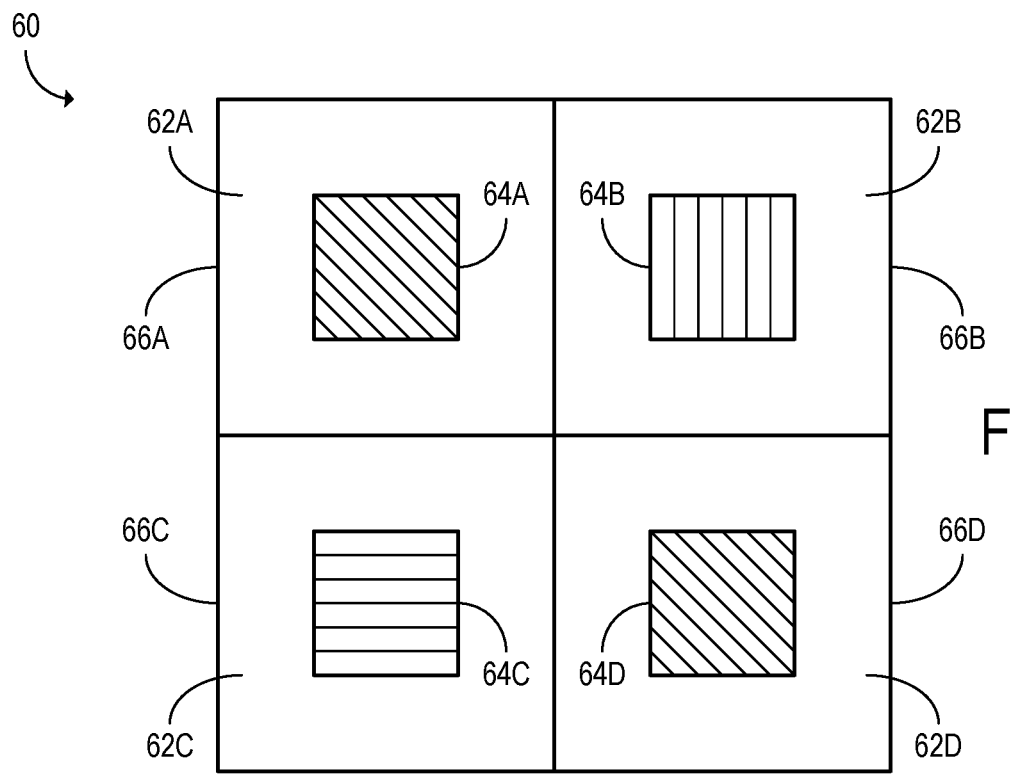
FIGS. 3A-C show example pixels of the three-dimensional TOF RGB-IR image sensor of FIG. 1.
Figure 3B:
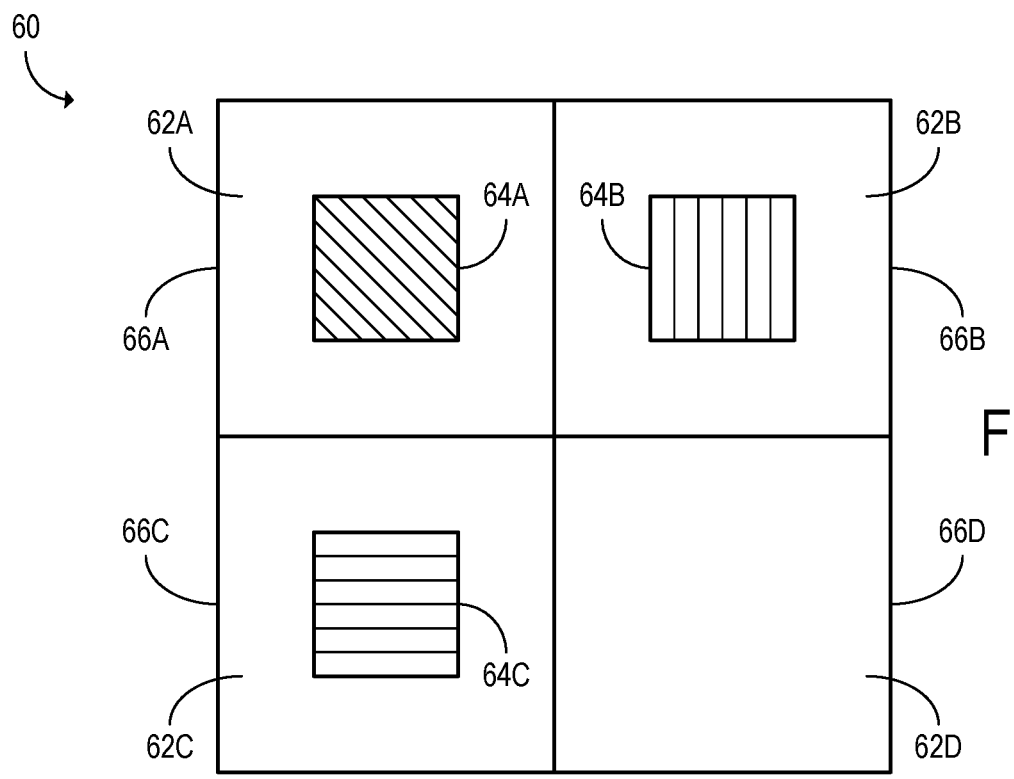
Figure 3C:
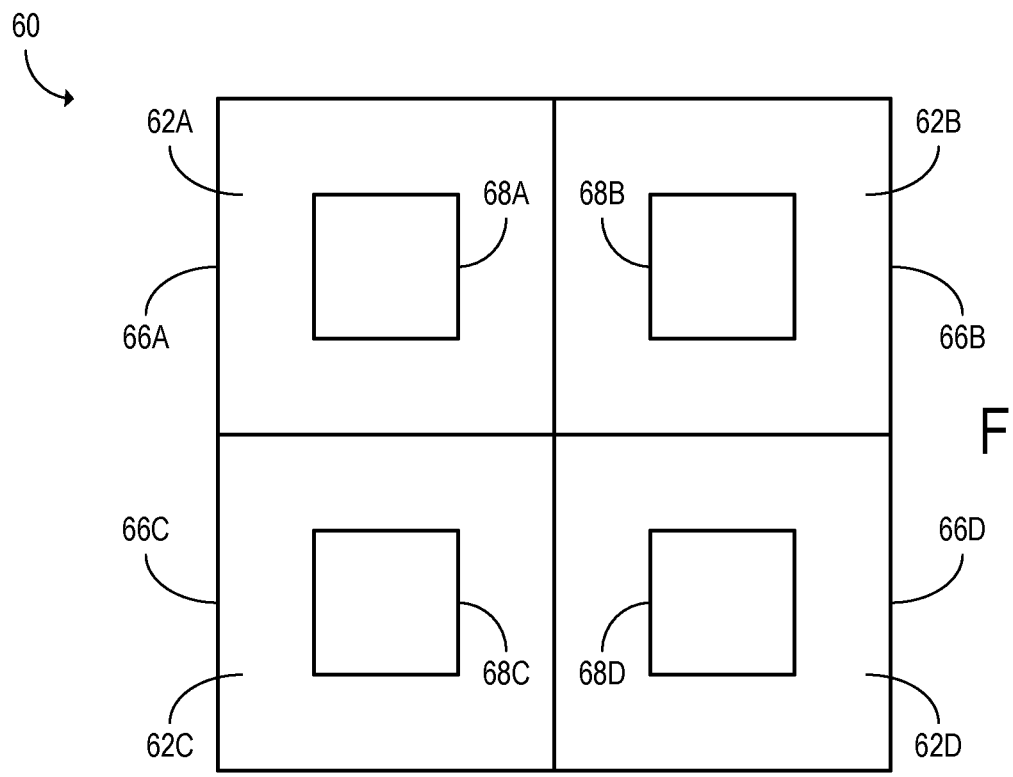

FIGS. 3A-C show example pixel configurations that may be used in some embodiments of the filter array 32. As shown in FIGS. 3A-C, each pixel 60 of the filter array 32 may include a plurality of visible-light-transmitting bandpass filters 64 arranged in respective subpixels 66. Each subpixel 66 may be a single photo-site. In each of FIGS. 3A-C, the pixel 60 includes four subpixels 66A, 66B, 66C, and 66D. However, other numbers of subpixels 66 may be included in a pixel 60 in other embodiments. In addition, although the pixel 60 and subpixels 66A, 66B, 66C, and 66D are rectangular, other shapes of pixels and/or subpixels may be used in other embodiments. In the embodiment of FIG. 3A, the filter array 32 is a Bayer filter. The first subpixel 66A includes a first visible-light-transmitting bandpass filter 64A configured to transmit green light, the second subpixel 66B includes a second visible-light-transmitting bandpass filter 64B configured to transmit blue light, the third subpixel 66C includes a third visible-light transmitting bandpass filter 64C configured to transmit red light, and the fourth subpixel 66D includes a fourth visible-light transmitting bandpass filter 64D configured to transmit green light. The subpixels 66A, 66B, 66C, and 66D also respectively include infrared-transmitting bandpass filters 62A, 62B, 62C, and 62D adjacent to and surrounding the visible-light-transmitting bandpass filters 64A, 64B, 64C, and 64D in the plane of the filter array 32.

FIG. 3B shows an example pixel 60 similar to the pixel 60 of FIG. 3A except that the fourth subpixel 66D does not include a visible-light-transmitting bandpass filter 64. Instead, the fourth subpixel 66D is a reference subpixel including an infrared-transmitting bandpass filter 62D. The reference subpixel 66D may be used to calibrate TOF measurements made using the visible-light-transmitting bandpass filters 64A, 64B, and 64C, as discussed in further detail below.

FIG. 3C shows an example pixel 60 in which the visible-light-transmitting bandpass filters 64 are full-visible-spectrum bandpass filters 68A, 68B, 68C, and 68D. When the example pixel 60 of FIG. 3C is used in the filter array 32, the full-visible-spectrum bandpass filters 68 may allow for detection of the presence of visible light without detecting the color of the visible light. Measurements of IR light may be made separately by the infrared-transmitting bandpass filters 62A, 62B, 62C, and 62D when the example pixel 60 of FIG. 3C is used.

In other embodiments, not shown in FIGS. 3A-C, the filter array 32 may include pixels 60 with other arrangements of visible-light-transmitting bandpass filters 64. For example, some or all of the filter array 32 may an RGBE (red-green-blue-emerald) filter, a CYYM (cyan-yellow-yellow-magenta) filter, a CYGM (cyan-yellow-green-magenta) filter, or an RGBW (red-green-blue-white) Bayer filter. In some embodiments, one or more pixels 60 of the filter array 32 may include sixteen subpixels 66 arranged in a square grid. In such embodiments, the one or more pixels 66 may be RGBW (red-green-blue-white) pixels.

Figure 3D:
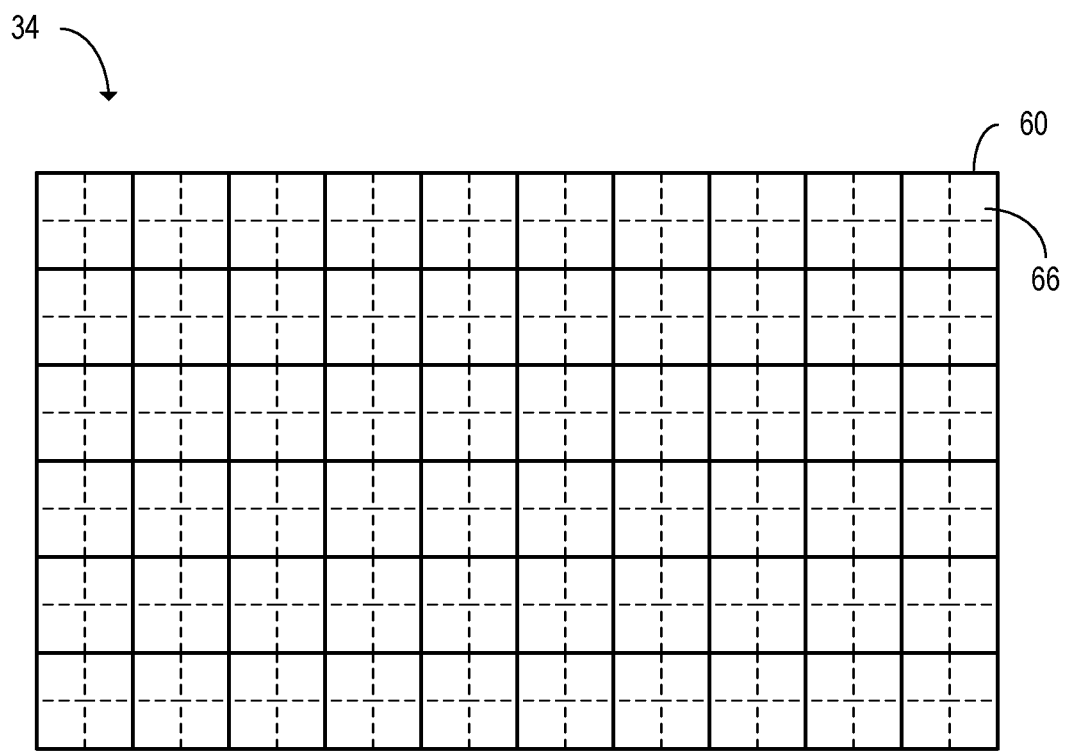
FIG. 3D shows an example filter array including a plurality of pixels, according to the embodiment of FIG. 1.

FIG. 3D shows an example filter array 34 including a plurality of pixels 60. In the example of FIG. 3D, each pixel 60 includes four subpixels 66. Each pixel 60 included in the example filter array 34 of FIG. 3D may have the configuration of one of the example pixels 60 shown in FIGS. 3A-C. In other embodiments, other pixel configurations may be used for the filter array 34. The filter array 34 may include a mix of pixels 60 with different configurations, or alternatively may include pixels 60 that all have the same configuration.

Since the pixels 60 shown in FIGS. 3A-D each include both an infrared-transmitting bandpass filter 62 and a visible-light-transmitting bandpass filter 64, separate sensor arrays for color measurement and TOF measurement are not required. Instead, as shown in FIGS. 3A-D, color measurements and TOF measurements may be made along a shared boresight. This shared boresight allows color measurements and TOF measurements to be made with the same distance and angle to the imaged object 12. Thus, calculating distance and making angle corrections for close-range measurements may be avoided. In addition, sensors may be prevented from occluding each other.

Figure 4A:
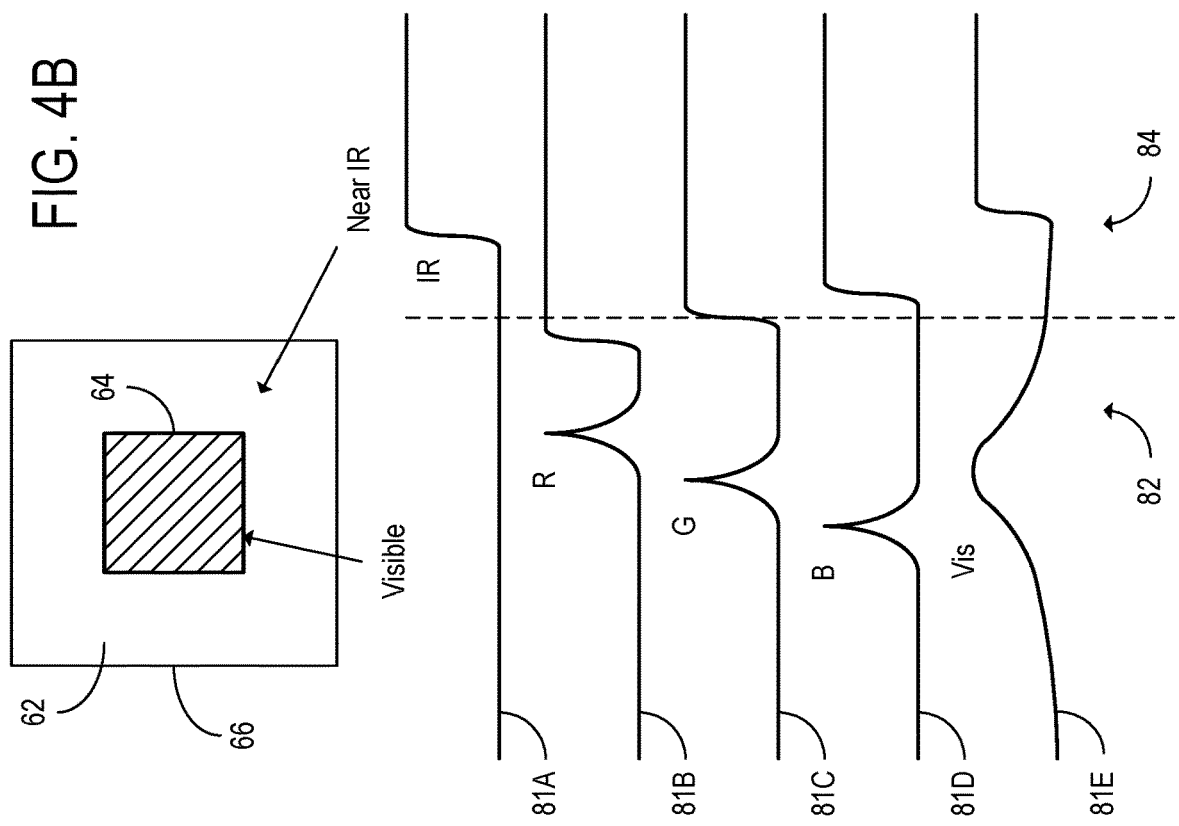
FIGS. 4A-B show example transmittance curves of an infrared-transmitting bandpass filter and a visible-light-transmitting bandpass filter, according to the embodiment of FIG. 1.

Turning now to FIG. 4A, a plurality of example transmittance curves of subpixels 66 are shown. The example subpixel 66 shown in FIG. 4A includes an infrared-transmitting bandpass filter 62 and a visible-light-transmitting bandpass filter 64. As shown in the IR transmittance curve 80A, the transmittance of the infrared-transmitting bandpass filter 62 peaks in the near-IR region of the electromagnetic spectrum in the example of FIG. 4A. FIG. 4A also shows example transmittance curves 80B, 80C, 80D, and 80E of the visible-light-transmitting bandpass filter 64. In embodiments in which the visible-light-transmitting bandpass filter 64 is configured to transmit red light, the visible-light-transmitting bandpass filter 64 may have transmittance curve 80B. In embodiments in which the visible-light-transmitting bandpass filter 64 is configured to transmit green light, the visible-light-transmitting bandpass filter 64 may have transmittance curve 80C. In embodiments in which the visible-light-transmitting bandpass filter 64 is configured to transmit blue light, the visible-light-transmitting bandpass filter 64 may have transmittance curve 80D. In embodiments in which the visible-light-transmitting bandpass filter 64 is configured to transmit full-visible-spectrum light, the visible-light-transmitting bandpass filter 64 may have transmittance curve 80E. In other embodiments, the visible-light-transmitting bandpass filter 64 may have a transmittance curve not shown in FIG. 4A.

Figure 4B:
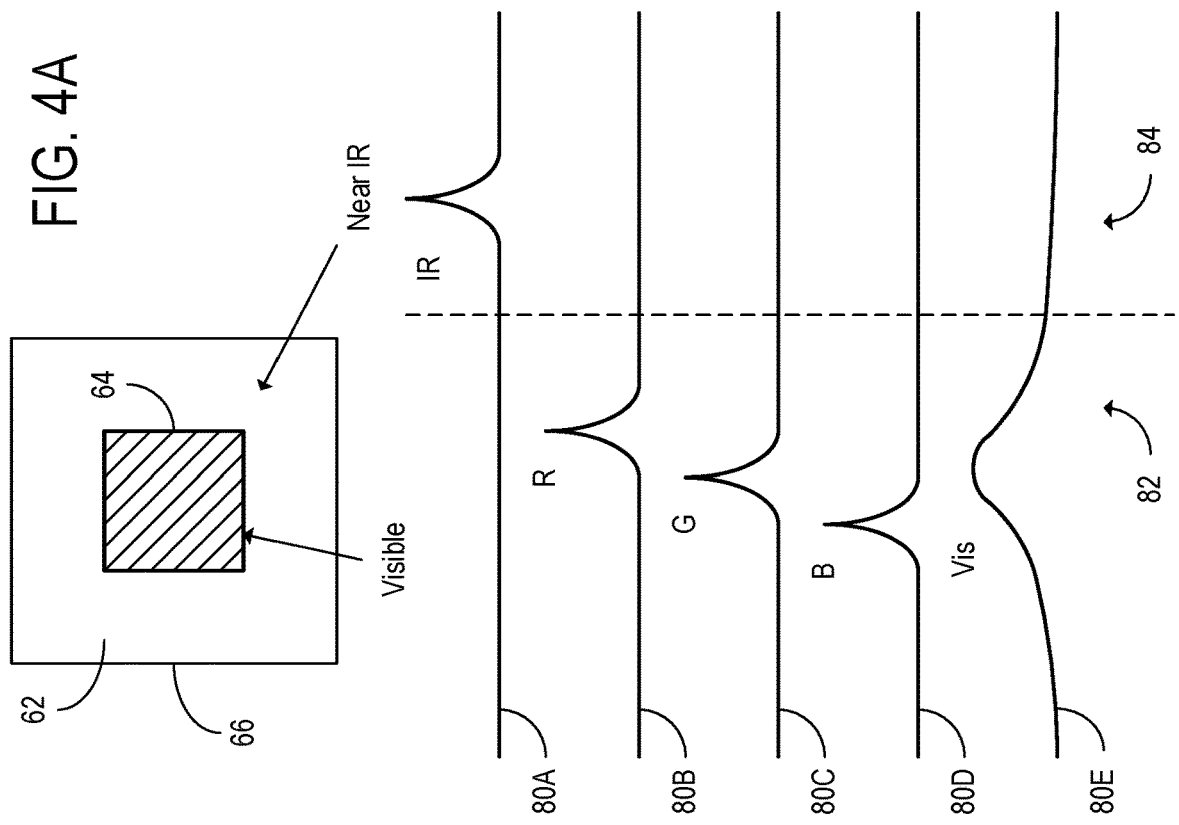

FIG. 4B shows transmittance curves 81A, 81B, 81C, 81D, and 81E that the infrared-transmitting bandpass filter 62 and the visible-light-transmitting bandpass filter 64 may have when IR leakage occurs. IR leakage results when the visible-light-transmitting bandpass filter 64 transmits IR light in addition to visible light. As shown in FIG. 4B, the visible-light-transmitting bandpass filter 64 may have a high transmittance for near IR light.

In order to correct for the IR leakage seen in FIG. 4B, the reference subpixel 66D shown in FIG. 3B may be included in the pixel 60. Since the reference subpixel 66D only includes an infrared-transmitting bandpass filter 62D and not a visible-light-transmitting bandpass filter 64, a signal received via the reference subpixel 66D may be subtracted from the signals received via the other subpixels 66 to adjust the signals from those subpixels 66 for IR leakage.

Returning to FIG. 1, after the received light 44 has passed through the filter array 32 and reached the light-receiving surface of the TOF sensor integrated circuit 30, the plurality of photodetector cells 58 included in the photodetector layer 56 of the TOF sensor integrated circuit 30 may be configured to receive light and generate a photoelectrical signal when the received light 44 is incident upon the photodetector layer 56. The photoelectrical signal may then be transmitted to the controller 24. In some embodiments, the photoelectrical electrical signal may be amplified prior to transmission to the controller 24.

The three-dimensional TOF RGB-IR image sensor 10 may, in some configurations, include a phase shifter 28. The phase shifter 28 may be configured to receive the modulated electrical signal from the signal generator 20 and apply a phase shift including one or more phase shift steps to the modulated electrical signal. The phase shifter 28 may be further configured to transmit the modulated electrical signal from the signal generator 20 to the TOF sensor integrated circuit 30, where the modulated electrical signal may correlate with the photoelectrical signal. Thus, the phase shifter 28 may demodulate the modulated electrical signal from the photoelectrical signal to extract one or more components of the photoelectrical signal associated with light reflected off the imaged object 12. The signal resulting from the demodulation may be a correlation electrical signal.

After the modulated electrical signal has been demodulated from the photoelectrical signal, the controller 24 may receive the correlation electrical signal from the TOF sensor integrated circuit 30. The controller 24 may be further configured to determine, based on a phase difference between the correlation electrical signal and the modulated electrical signal, a time of flight of the reflected modulated light. An example algorithm by which the phase difference may be determined in some embodiments is provided below. The example algorithm is an algorithm for determining the phase difference between the correlation electrical signal and an amplitude-modulated electrical signal. In this example, the phase difference is determined for a simplified correlation between one frequency component of the photoelectrical signal associated with light reflected off the imaged object 12 and one frequency component associated with the modulated electrical signal. The correlation of the frequency components for one frame captured by a pixel 60 is given by the following equation:

$$I_{0k} = CM_0 AB_0 \cdot \cos(\varphi_{d0} \psi_k) \quad \text{Eq.1}$$

In this equation, $CM_0$ is a common mode voltage signal corresponding to a direct current (DC) signal received from the pixel 60. $CM_0$ includes signals associated with both the modulated light 40 emitted by the LED 22 and ambient light 42 emitted by the ambient light source 14. An equation for $CM_0$ is given below:

$$CM_0 = \frac{1}{N} \sum_k I_{0k} \quad \text{Eq. 2}$$

In Eq. 2, N is the total number of phase shifting steps.

Returning to Eq. 1, $AB_0$ is the amplitude of an alternating voltage of the modulated light 40. $\varphi_{d0}=2\pi ft_{d0}$ is the phase of the time of flight $t_{d0}$, and $\psi_k$ is the $k_{th}$ phase shift. An equation for $AB_0$ is given below:

$$AB_0 = \frac{2}{N}\sqrt{[\sum_k I_{0k} \cdot \sin(\psi_k)]^2 + [\sum_k I_{0k} \cdot \cos(\psi_k)]^2} \qquad \text{Eq. 3}$$

In addition, an equation for $\varphi_{d0}$ is given below:

$$\varphi_{d0} = a\tan\frac{-\sum_k I_k \cdot \sin(\psi_k)}{\sum_k I_k \cdot \cos(\psi_k)} \text{ for } k = 1, 2, 3\ldots \qquad \text{Eq. 4}$$

In Eq. 4, $I_k$ is the correlation result of voltage output contributed by the photoelectrical signal at the $k^{th}$ phase shifting step from each pixel 60.

Although the above example is provided for a single frequency, the above example may be extended to signals including multiple components with different frequencies by summing over the components. Thus, a single pixel 60 may concurrently provide time-of-flight data for a plurality of different wavelengths of light.

Figure 5A:
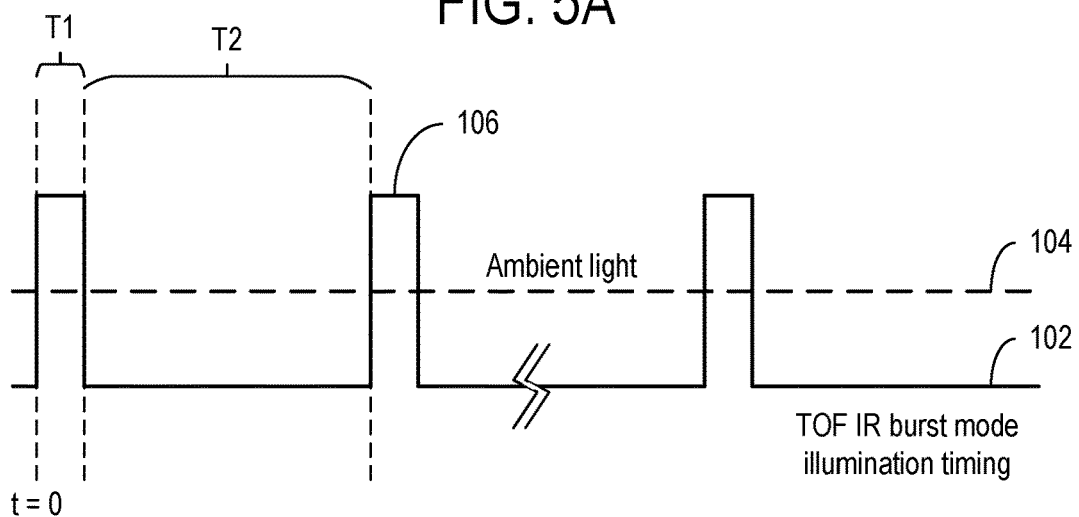
FIG. 5A shows an example TOF IR burst mode illumination timing curve, according to the embodiment of FIG. 1.
Figure 5B:
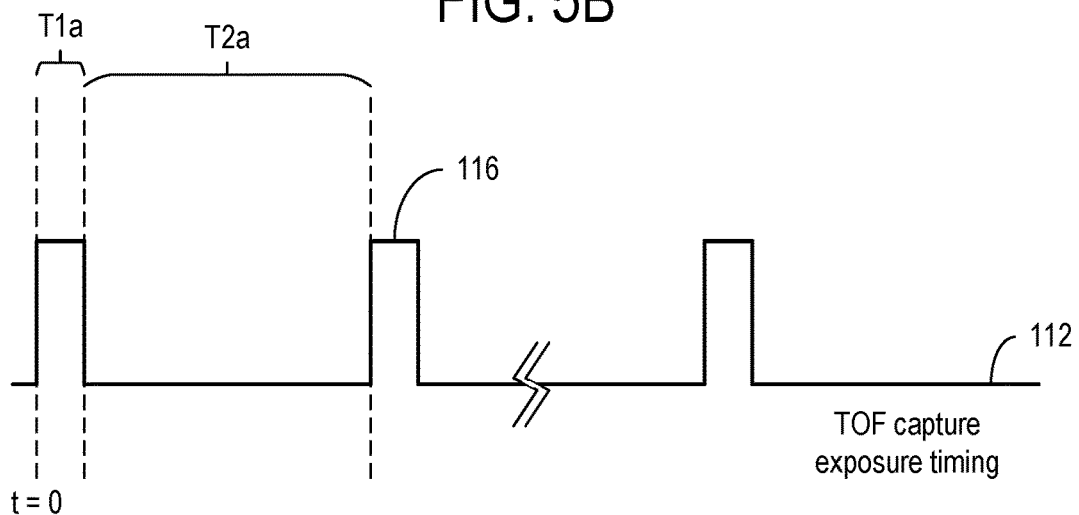
FIG. 5B shows an example TOF capture exposure timing curve, according to the embodiment of FIG. 1.
Figure 5C:
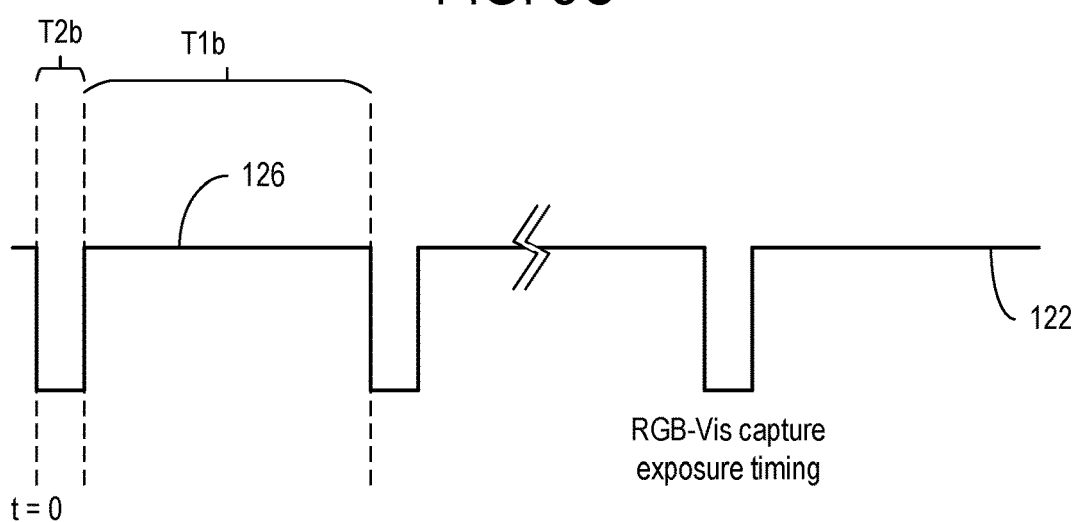
FIG. 5C shows an example RGB-Vis capture exposure timing curve, according to the embodiment of FIG. 1.

Turning now to FIGS. 5A-C, example illumination and integration curves showing patterns of light emission and measurement by the three-dimensional TOF RGB-IR image sensor 10 are shown. FIG. 5A shows an example TOF IR burst mode illumination timing curve 102. In the embodiment of FIG. 2, the modulated electrical signal is generated to include a plurality of bursts 106 of IR light that each have duration Ti and are each emitted at a predetermined period T2 by the LED 22. As shown in FIG. 5A, the duration T1 of each burst 106 may be less than the predetermined period T2. FIG. 5A also shows an ambient light curve 104, which is constant in the example of FIG. 5A.

FIG. 5B shows a TOF capture exposure timing curve 112 that indicates a plurality of IR integration frames 116 within which IR light is measured at the TOF sensor integrated circuit 30. Each IR integration frame 116 may have a duration T1*a* and may occur with a predetermined period T2*a*. In some embodiments, the duration T1*a* of the IR integration frames 116 may equal the duration T1 of the bursts 106 shown in FIG. 5A. Additionally or alternatively, the predetermined period T1*a* between the IR integration frames 116 may equal the predetermined period T1 between the bursts 106 shown in FIG. 5A. In other embodiments, the durations T1 and T1*a* may have different values.

FIG. 5C shows an RGB-Vis capture exposure timing curve 122 that indicates a plurality of visible-light integration frames 126 within which visible light is measured at the TOF sensor integrated circuit 30. Each visible-light integration frame 126 may have a duration T1*b* and may occur with a predetermined period T2*b*. As shown in FIG. 5C, the three-dimensional TOF RGB-IR image sensor 10 may be configured such that the visible-light integration frames 126 occur at times when the bursts 106 of FIG. 5A are not emitted and the IR integration frames 116 of FIG. 5B do not occur. Thus, the TOF sensor integrated circuit 30 may respectively integrate measurements of each of IR light and visible light when the other is not being integrated. In addition, since visible light is not integrated when IR light is actively emitted in such embodiments, contamination of the visible light signal with IR light as shown in FIG. 4B may be avoided.

Although FIGS. 5A-C show an embodiment in which depth measurements and color measurements are asynchronized, the depth measurements and color measurements may be synchronized in other embodiments such that the IR integration frames 116 overlap with the visible-light integration frames 126. In such embodiments, the IR integration frames 116 may be the same as the visible-light integration frames 126.

Figure 6A:
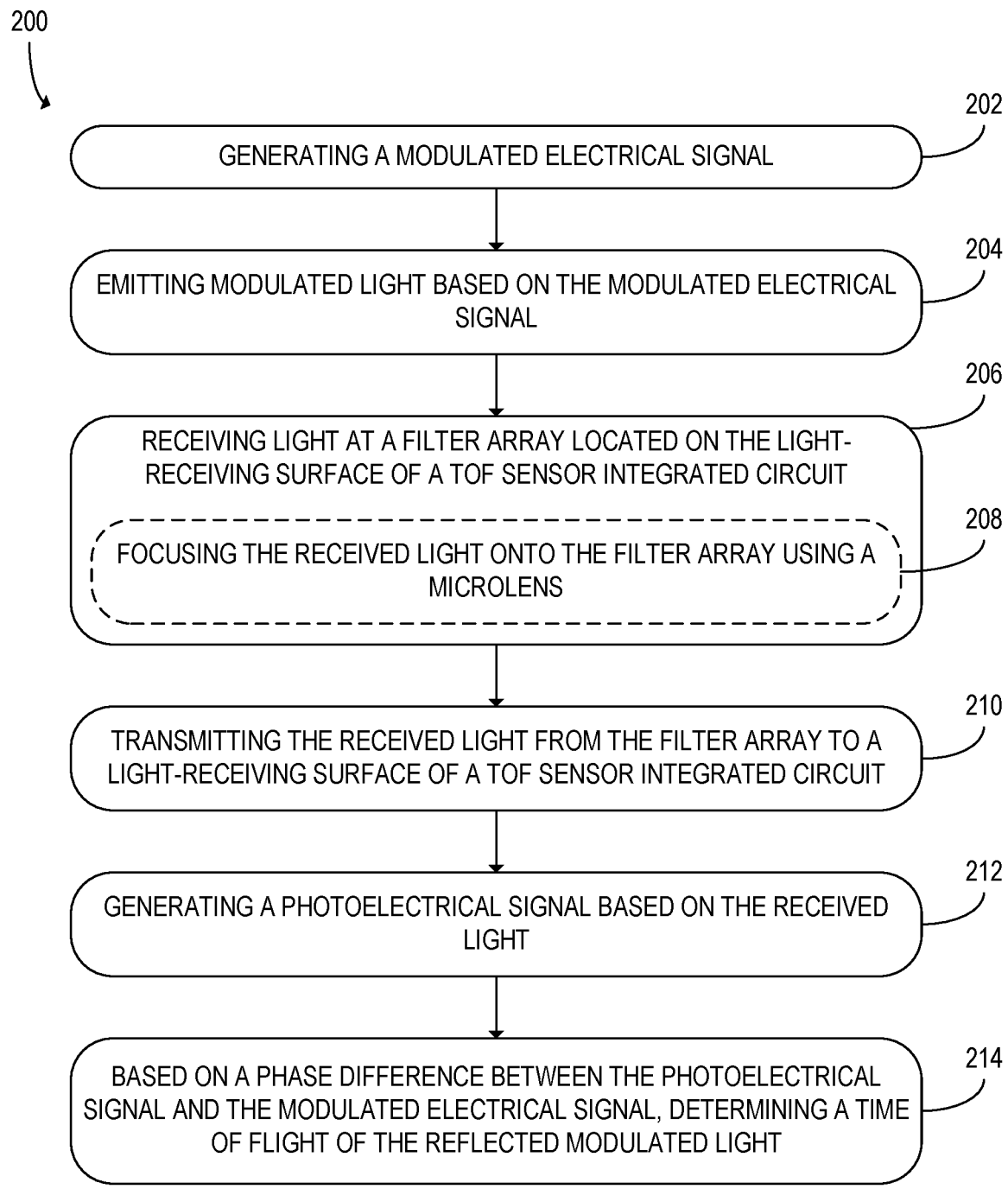
FIG. 6A shows an example method that may be performed at the three-dimensional TOF RGB-IR image sensor of FIG. 1.

FIG. 6A shows a flowchart of an example method 200 that may be used with the three-dimensional TOF RGB-IR image sensor 10 of FIG. 1, or with some other three-dimensional TOF RGB-IR image sensor, to obtain time-of-flight data and/or color data related to an imaged object. At step 202, the method 200 may include generating a modulated electrical signal, which may be an amplitude-modulated electrical signal or a frequency-modulated electrical signal. The modulated electrical signal may be generated at a signal generator and may be generated in response to a control signal received from a controller. At step 204, the method 200 may further include emitting modulated light based on the modulated electrical signal. The modulated light may be emitted at an LED or alternatively at some other light source.

At step 206, the method 200 may further include receiving light at a filter array located on the light-receiving surface of a TOF sensor integrated circuit. The filter array used in step 206 may include an infrared-transmitting bandpass filter. The filter array may further include one or more visible-light-transmitting bandpass filters located adjacent to the infrared-transmitting bandpass filter. The received light may include ambient light emitted by an ambient light source. The received light may further include reflected modulated light, which may be the modulated light reflected off the imaged object. In some embodiments, step 206 may further include step 208, at which the method 200 further includes focusing the received light onto the filter array using a micro-lens. The micro-lens may be located on a light-receiving side of the filter array opposite the TOF sensor integrated circuit. At step 210, the method 200 may further include transmitting the received light from the filter array to a light-receiving surface of a TOF sensor integrated circuit.

At step 212, the method 200 may further include generating a photoelectrical signal based on the received light. The photoelectrical signal may be generated, for example, via the photoelectric effect at a photodetector layer of the TOF sensor integrated circuit. At step 214, the method 200 may further include, based on a phase difference between the photoelectrical signal and the modulated electrical signal, determining a time of flight of the reflected modulated light. The time of flight may be determined at a controller to which the TOF sensor integrated circuit is configured to transmit the photoelectrical signal. In other embodiments, the time of flight may be determined at the TOF sensor integrated circuit.

Figure 6B:
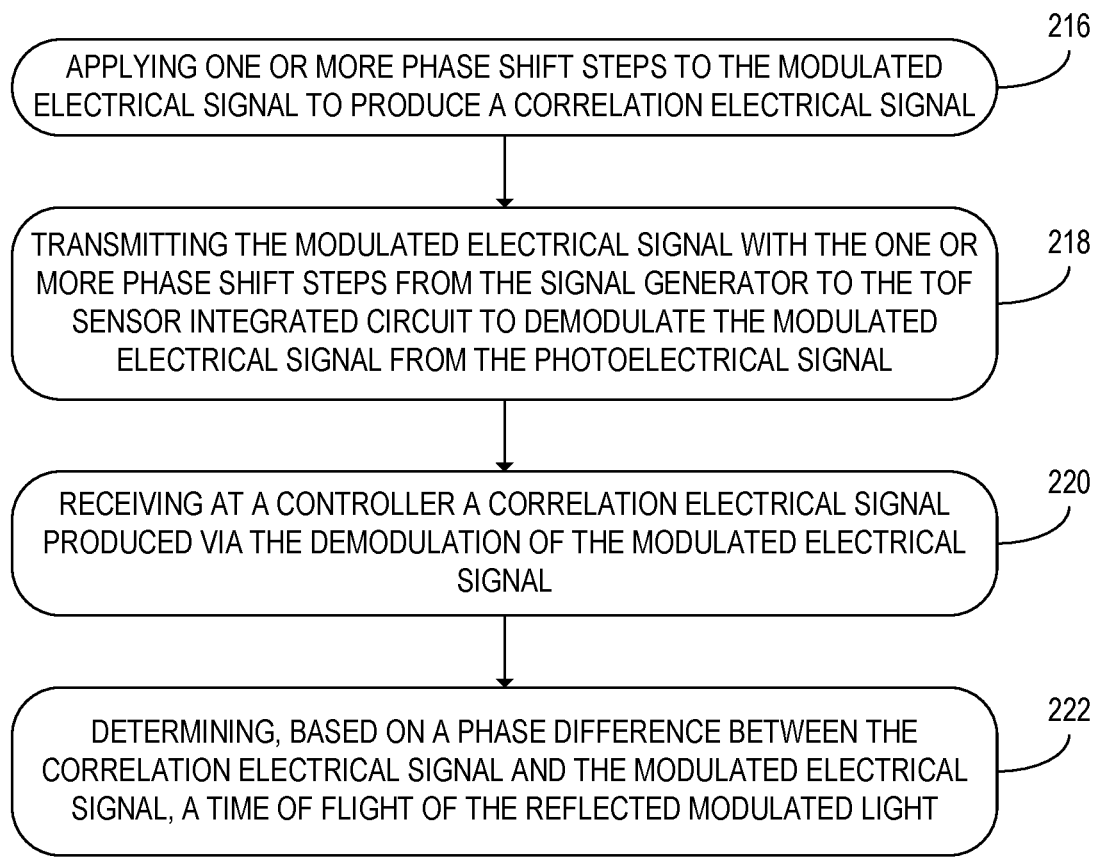
FIGS. 6B-C show additional steps that may be performed in some implementations of the method of FIG. 6A.
Figure 6C:
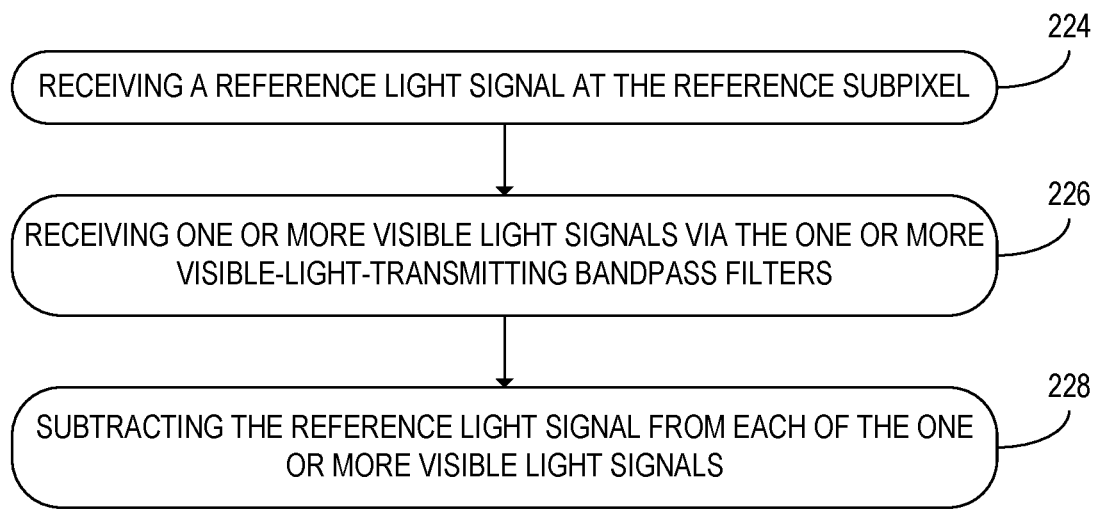

FIGS. 6B and 6C show additional steps that may be included in the method 200 in some embodiments. As shown in FIG. 6B, the method 200 may include, at step 216, applying one or more phase shift steps to the modulated electrical signal to produce a correlation electrical signal. The method 200 may further include, at step 218, transmitting the modulated electrical signal with the one or more phase shift steps from the signal generator to the TOF sensor integrated circuit to demodulate the modulated electrical signal from the photoelectrical signal. At step 220, the method 200 may further include receiving at a controller a correlation electrical signal produced via the demodulation of the modulated electrical signal. The correlation electrical signal may be transmitted to the controller from the TOF sensor integrated circuit. In some embodiments, the correlation electrical signal may be amplified at the TOF sensor integrated circuit prior to being received at the controller. At step 222, the method 200 may include determining, based on a phase difference between the correlation electrical signal and the modulated electrical signal, a time of flight of the reflected modulated light. Thus, in the embodiment of FIG. 6B, the photoelectrical signal may be demodulated prior to being used to determine the time of flight.

In some embodiments, the filter array may further include a reference subpixel including an infrared-transmitting bandpass filter and not including a visible-light-transmitting bandpass filter. In such embodiments, the method 200 may further include the steps of FIG. 6C. At step 224, the method 200 may further include receiving a reference light signal at the reference subpixel. At step 226, the method 200 may further include receiving one or more visible light signals via the one or more visible-light-transmitting bandpass filters. The reference light signal and the one or more visible light signals may each pass through the filter array and be absorbed by a photodetector layer of the TOF sensor integrated circuit. At step 228, the method 200 may further include subtracting the reference light signal from each of the one or more visible light signals. Thus, the one or more visible light signals may be calibrated to remove IR leakage. Subtracting the reference light signal from each of the one or more visible light signals may include generating a respective electrical signal from each of the reference light signal and the one or more visible light signals.

In some embodiments, the methods and processes described herein may be tied to a computing system of one or more computing devices. In particular, such methods and processes may be implemented as a computer-application program or service, an application-programming interface (API), a library, and/or other computer-program product.

Figure 7:
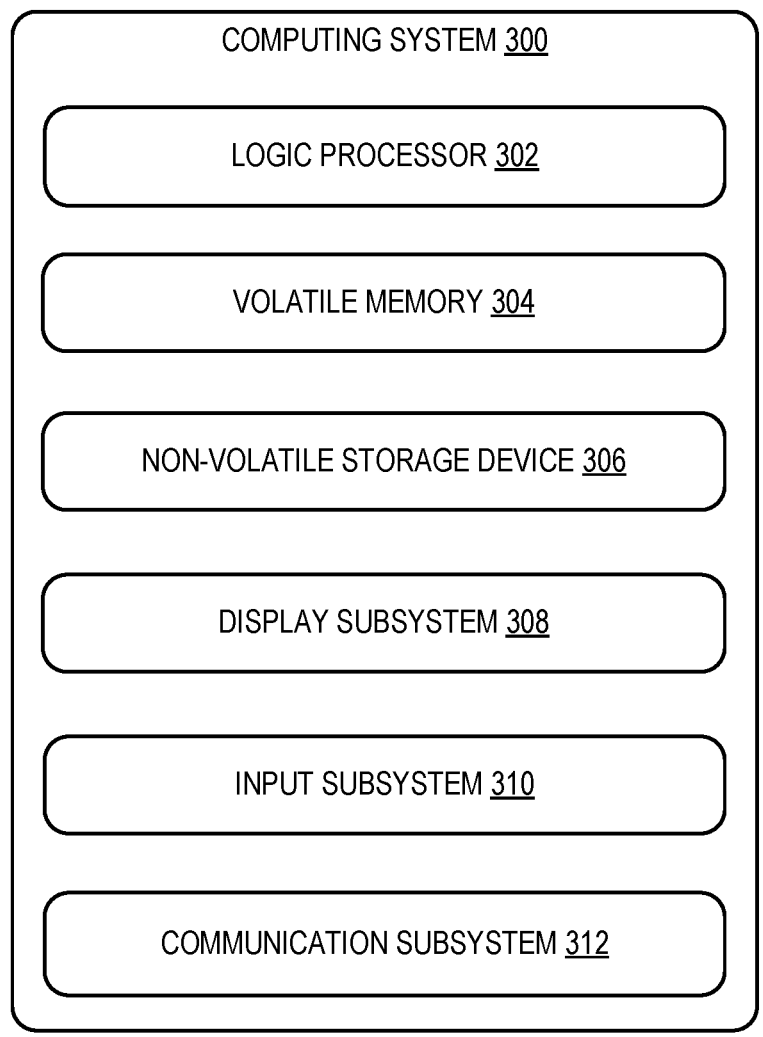
FIG. 7 shows a schematic view of an example computing environment in which the systems and methods described herein may be implemented.

FIG. 7 schematically shows a non-limiting embodiment of a computing system 300 that can enact one or more of the methods and processes described above. Computing system 300 is shown in simplified form. Computing system 300 may embody the three-dimensional TOF RGB-IR image sensor 10 described above and illustrated in FIG. 1. Computing system 300 may take the form of one or more personal computers, server computers, tablet computers, home-entertainment computers, network computing devices, gaming devices, mobile computing devices, mobile communication devices (e.g., smart phone), and/or other computing devices, and wearable computing devices such as smart wristwatches and head mounted augmented reality devices.

Computing system 300 includes a logic processor 302 volatile memory 304, and a non-volatile storage device 306. Computing system 300 may optionally include a display subsystem 308, input subsystem 310, communication subsystem 312, and/or other components not shown in FIG. 7.

Logic processor 302 includes one or more physical devices configured to execute instructions. For example, the logic processor may be configured to execute instructions that are part of one or more applications, programs, routines, libraries, objects, components, data structures, or other logical constructs. Such instructions may be implemented to perform a task, implement a data type, transform the state of one or more components, achieve a technical effect, or otherwise arrive at a desired result.

The logic processor may include one or more physical processors (hardware) configured to execute software instructions. Additionally or alternatively, the logic processor may include one or more hardware logic circuits or firmware devices configured to execute hardware-implemented logic or firmware instructions. Processors of the logic processor 302 may be single-core or multi-core, and the instructions executed thereon may be configured for sequential, parallel, and/or distributed processing. Individual components of the logic processor optionally may be distributed among two or more separate devices, which may be remotely located and/or configured for coordinated processing. Aspects of the logic processor may be virtualized and executed by remotely accessible, networked computing devices configured in a cloud-computing configuration. In such a case, these virtualized aspects are run on different physical logic processors of various different machines, it will be understood.

Non-volatile storage device 306 includes one or more physical devices configured to hold instructions executable by the logic processors to implement the methods and processes described herein. When such methods and processes are implemented, the state of non-volatile storage device 306 may be transformed—e.g., to hold different data.

Non-volatile storage device 306 may include physical devices that are removable and/or built-in. Non-volatile storage device 306 may include optical memory (e.g., CD, DVD, HD-DVD, Blu-Ray Disc, etc.), semiconductor memory (e.g., ROM, EPROM, EEPROM, FLASH memory, etc.), and/or magnetic memory (e.g., hard-disk drive, floppy-disk drive, tape drive, MRAM, etc.), or other mass storage device technology. Non-volatile storage device 306 may include nonvolatile, dynamic, static, read/write, read-only, sequential-access, location-addressable, file-addressable, and/or content-addressable devices. It will be appreciated that non-volatile storage device 306 is configured to hold instructions even when power is cut to the non-volatile storage device 306.

Volatile memory 304 may include physical devices that include random access memory. Volatile memory 304 is typically utilized by logic processor 302 to temporarily store information during processing of software instructions. It will be appreciated that volatile memory 304 typically does not continue to store instructions when power is cut to the volatile memory 304.

Aspects of logic processor 302, volatile memory 304, and non-volatile storage device 306 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

The terms "module," "program," and "engine" may be used to describe an aspect of computing system 300 typically implemented in software by a processor to perform a particular function using portions of volatile memory, which function involves transformative processing that specially configures the processor to perform the function. Thus, a module, program, or engine may be instantiated via logic processor 302 executing instructions held by non-volatile storage device 306, using portions of volatile memory 304. It will be understood that different modules, programs, and/or engines may be instantiated from the same application, service, code block, object, library, routine, API, function, etc. Likewise, the same module, program, and/or engine may be instantiated by different applications, services, code blocks, objects, routines, APIs, functions, etc. The terms "module," "program," and "engine" may encompass individual or groups of executable files, data files, libraries, drivers, scripts, database records, etc.

When included, display subsystem 308 may be used to present a visual representation of data held by non-volatile storage device 306. The visual representation may take the form of a graphical user interface (GUI). As the herein described methods and processes change the data held by the non-volatile storage device, and thus transform the state of the non-volatile storage device, the state of display subsystem 308 may likewise be transformed to visually represent changes in the underlying data. Display subsystem 308 may include one or more display devices utilizing virtually any type of technology. Such display devices may be combined with logic processor 302, volatile memory 304, and/or non-volatile storage device 306 in a shared enclosure, or such display devices may be peripheral display devices.

When included, input subsystem 310 may comprise or interface with one or more user-input devices such as a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity; and/or any other suitable sensor.

When included, communication subsystem 312 may be configured to communicatively couple various computing devices described herein with each other, and with other devices. Communication subsystem 312 may include wired and/or wireless communication devices compatible with one or more different communication protocols. As non-limiting examples, the communication subsystem may be configured for communication via a wireless telephone network, or a wired or wireless local- or wide-area network, such as a HDMI over Wi-Fi connection. In some embodiments, the communication subsystem may allow computing system 300 to send and/or receive messages to and/or from other devices via a network such as the Internet.

According to one aspect of the present disclosure, a three-dimensional time-of-flight (TOF) RGB-IR image sensor is provided, including a signal generator configured to generate a modulated electrical signal. The three-dimensional TOF RGB-IR image sensor may further include a light-emitting diode (LED) or laser diode (LD) configured to receive the modulated electrical signal and emit modulated light. The three-dimensional TOF RGB-IR image sensor may further include a TOF sensor integrated circuit configured to receive light at a light-receiving surface and generate a photoelectrical signal based on the received light. The received light may include ambient light and reflected modulated light. The three-dimensional TOF RGB-IR image sensor may further include a filter array located on the light-receiving surface of the TOF sensor integrated circuit. The filter array may include a plurality of pixels, each pixel including an infrared-transmitting bandpass filter and one or more visible-light-transmitting bandpass filters located adjacent to the infrared-transmitting bandpass filter.

According to this aspect, the three-dimensional TOF RGB-IR image sensor may further include a phase shifter configured to apply one or more phase shift steps to the modulated electrical signal. The phase shifter may be further configured to transmit the modulated electrical signal with the phase shift steps from the signal generator to the TOF sensor integrated circuit to demodulate the modulated electrical signal from the photoelectrical signal. The three-dimensional TOF RGB-IR image sensor may further include a controller configured to receive a correlation electrical signal produced via the demodulation of the modulated electrical signal. The controller may be further configured to determine, based on a phase difference between the correlation electrical signal and the modulated electrical signal, a time of flight of the reflected modulated light.

According to this aspect, the modulated electrical signal may be generated to include a plurality of bursts each emitted at a predetermined period. For each burst, a duration of that burst may be less than the predetermined period.

According to this aspect, the TOF sensor integrated circuit may be configured to receive the received light within a plurality of integration frames. The integration frames may occur at the predetermined period.

According to this aspect, the one or more visible-light-transmitting bandpass filters may be configured to transmit light selected from the group consisting of red light, green light, blue light, cyan light, yellow light, magenta light, emerald light, and full-visible-spectrum light.

According to this aspect, the three-dimensional TOF RGB-IR image sensor may further include a micro-lens located on a light-receiving side of the filter array and configured to focus the received light onto the filter array.

According to this aspect, the three-dimensional TOF RGB-IR image sensor may further include a visible-transparent layer located between the TOF sensor integrated circuit and the filter array.

According to this aspect, each pixel may include a plurality of visible-light-transmitting bandpass filters arranged in respective subpixels.

According to this aspect, each pixel may include a plurality of subpixels including a first subpixel having a first transmission spectrum and a second subpixel having a second transmission spectrum different from the first transmission spectrum.

According to this aspect, each pixel may further include a reference subpixel including an infrared-transmitting bandpass filter and not including a visible-light-transmitting bandpass filter.

According to this aspect, wherein the TOF sensor integrated circuit may include a silicon substrate in which a wiring layer and a photodetector layer are mounted.

According to this aspect, the wiring layer may be located between the filter array and the photodetector layer.

According to this aspect, the photodetector layer may be located between the filter array and the wiring layer.

According to another aspect of the present disclosure, a method for use with a three-dimensional time-of-flight (TOF) RGB image sensor is provided. The method may include generating a modulated electrical signal. The method may further include emitting modulated light based on the modulated electrical signal. The method may further include receiving light at a filter array located on the light-receiving surface of a TOF sensor integrated circuit. The filter array may include an infrared-transmitting bandpass filter and one or more visible-light-transmitting bandpass filters located adjacent to the infrared-transmitting bandpass filter. The received light may include ambient light and reflected modulated light. The method may further include transmitting the received light from the filter array to a light-receiving surface of a TOF sensor integrated circuit. The method may further include generating a photoelectrical signal based on the received light. The method may further include, based on a phase difference between the photoelectrical signal and the modulated electrical signal, determining a time of flight of the reflected modulated light.

According to this aspect, the method may further include applying one or more phase shift steps to the modulated electrical signal to produce a correlation electrical signal. The method may further include transmitting the modulated electrical signal with the one or more phase shift steps from the signal generator to the TOF sensor integrated circuit to demodulate the modulated electrical signal from the photoelectrical signal. The method may further include receiving at a controller a correlation electrical signal produced via the demodulation of the modulated electrical signal. The method may further include determining, based on a phase difference between the correlation electrical signal and the modulated electrical signal, a time of flight of the reflected modulated light.

According to this aspect, the modulated electrical signal may be generated to include a plurality of bursts each emitted at a predetermined period. For each burst, a duration of that burst may be less than the predetermined period.

According to this aspect, the one or more visible-light-transmitting bandpass filters may be configured to transmit light selected from the group consisting of red light, green light, blue light, cyan light, yellow light, magenta light, emerald light, and full-visible-spectrum light.

According to this aspect, the filter array may further include a reference subpixel including an infrared-transmitting bandpass filter and not including a visible-light-transmitting bandpass filter. The method may further include receiving a reference light signal at the reference subpixel. The method may further include receiving one or more visible light signals via the one or more visible-light-transmitting bandpass filters. The method may further include subtracting the reference light signal from each of the one or more visible light signals.

According to another aspect of the present disclosure, a three-dimensional time-of-flight (TOF) RGB-IR image sensor is provided, including a TOF sensor integrated circuit including a light-receiving surface. The three-dimensional TOF RGB-IR image sensor may further include a filter array located on the light-receiving surface of the time-of-flight sensor integrated circuit. The filter array may include an infrared-transmitting bandpass filter. The filter array may further include one or more visible-light-transmitting bandpass filters located adjacent to the infrared-transmitting bandpass filter and configured to transmit light selected from the group consisting of red light, green light, blue light, cyan light, yellow light, magenta light, emerald light, and full-visible-spectrum light.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A three-dimensional time-of-flight (TOF) RGB-IR image sensor comprising:
   a signal generator configured to generate a modulated electrical signal;
   a light-emitting diode (LED) or laser diode (LD) configured to receive the modulated electrical signal and emit modulated light;
   a TOF sensor integrated circuit configured to receive light at a light-receiving surface and generate a photoelectrical signal based on the received light, wherein the received light includes ambient light and reflected modulated light; and
   a filter array located on the light-receiving surface of the TOF sensor integrated circuit, wherein the filter array includes a plurality of pixels, each pixel including:
      an infrared-transmitting bandpass filter; and
      one or more visible-light-transmitting bandpass filters located adjacent to the infrared-transmitting bandpass filter.

2. The three-dimensional TOF RGB-IR image sensor of claim 1, further comprising:
   a phase shifter configured to:
      apply one or more phase shift steps to the modulated electrical signal; and
      transmit the modulated electrical signal with the phase shift steps from the signal generator to the TOF sensor integrated circuit to demodulate the modulated electrical signal from the photoelectrical signal; and
   a controller configured to:
      receive a correlation electrical signal produced via the demodulation of the modulated electrical signal; and
      determine, based on a phase difference between the correlation electrical signal and the modulated electrical signal, a time of flight of the reflected modulated light.

3. The three-dimensional TOF RGB-IR image sensor of claim 1, wherein:
   the modulated electrical signal is generated to include a plurality of bursts each emitted at a predetermined period; and
   for each burst, a duration of that burst is less than the predetermined period.

4. The three-dimensional TOF RGB-IR image sensor of claim 3, wherein the TOF sensor integrated circuit is configured to receive the received light within a plurality of integration frames, wherein the integration frames occur at the predetermined period.

5. The three-dimensional TOF RGB-IR image sensor of claim 1, wherein the one or more visible-light-transmitting bandpass filters are configured to transmit light selected from the group consisting of red light, green light, blue light, cyan light, yellow light, magenta light, emerald light, and full-visible-spectrum light.

6. The three-dimensional TOF RGB-IR image sensor of claim 1, further comprising a micro-lens located on a light-receiving side of the filter array and configured to focus the received light onto the filter array.

7. The three-dimensional TOF RGB-IR image sensor of claim 1, further comprising a visible-transparent layer located between the TOF sensor integrated circuit and the filter array.

8. The three-dimensional TOF RGB-IR image sensor of claim 1, wherein each pixel includes a plurality of visible-light-transmitting bandpass filters arranged in respective subpixels.

9. The three-dimensional TOF RGB-IR image sensor of claim 8, wherein each pixel includes a plurality of subpixels including a first subpixel having a first transmission spectrum and a second subpixel having a second transmission spectrum different from the first transmission spectrum.

10. The three-dimensional TOF RGB-IR image sensor of claim 8, wherein each pixel further includes a reference subpixel including an infrared-transmitting bandpass filter and not including a visible-light-transmitting bandpass filter.

11. The three-dimensional TOF RGB-IR image sensor of claim 1, wherein the TOF sensor integrated circuit includes a silicon substrate in which a wiring layer and a photodetector layer are mounted.

12. The three-dimensional TOF RGB-IR image sensor of claim 11, wherein the wiring layer is located between the filter array and the photodetector layer.

13. The three-dimensional TOF RGB-IR image sensor of claim 11, wherein the photodetector layer is located between the filter array and the wiring layer.

14. A method for use with a three-dimensional time-of-flight (TOF) RGB image sensor, the method comprising:
generating a modulated electrical signal;
emitting modulated light based on the modulated electrical signal;
receiving light at a filter array located on a light-receiving surface of a TOF sensor integrated circuit, wherein:
the filter array includes an infrared-transmitting bandpass filter and one or more visible-light-transmitting bandpass filters located adjacent to the infrared-transmitting bandpass filter; and
the received light includes ambient light and reflected modulated light;
transmitting the received light from the filter array to a light-receiving surface of a TOF sensor integrated circuit;
generating a photoelectrical signal based on the received light; and
based on a phase difference between the photoelectrical signal and the modulated electrical signal, determining a time of flight of the reflected modulated light.

15. The method of claim 14, further comprising:
applying one or more phase shift steps to the modulated electrical signal to produce a correlation electrical signal;
transmitting the modulated electrical signal with the one or more phase shift steps from the signal generator to the TOF sensor integrated circuit to demodulate the modulated electrical signal from the photoelectrical signal;
receiving at a controller a correlation electrical signal produced via the demodulation of the modulated electrical signal; and
determining, based on a phase difference between the correlation electrical signal and the modulated electrical signal, a time of flight of the reflected modulated light.

16. The method of claim 14, wherein:
the modulated electrical signal is generated to include a plurality of bursts each emitted at a predetermined period; and
for each burst, a duration of that burst is less than the predetermined period.

17. The method of claim 14, wherein the one or more visible-light-transmitting bandpass filters are configured to transmit light selected from the group consisting of red light, green light, blue light, cyan light, yellow light, magenta light, emerald light, and full-visible-spectrum light.

18. The method of claim 14, further comprising focusing the received light onto the filter array using a micro-lens.

19. The method of claim 14, wherein the filter array further includes a reference subpixel including an infrared-transmitting bandpass filter and not including a visible-light-transmitting bandpass filter, the method further comprising:
receiving a reference light signal at the reference subpixel;
receiving one or more visible light signals via the one or more visible-light-transmitting bandpass filters; and
subtracting the reference light signal from each of the one or more visible light signals.

20. A three-dimensional time-of-flight (TOF) RGB-IR image sensor comprising:
a TOF sensor integrated circuit including a light-receiving surface; and
a filter array located on the light-receiving surface of the time-of-flight sensor integrated circuit, wherein the filter array includes:
an infrared-transmitting bandpass filter; and
one or more visible-light-transmitting bandpass filters located adjacent to the infrared-transmitting bandpass filter and configured to transmit light selected from the group consisting of red light, green light, blue light, cyan light, yellow light, magenta light, emerald light, and full-visible-spectrum light.

* * * * *